United States Patent [19]

Monroe

[11] 4,188,567
[45] Feb. 12, 1980

[54] CONSTANT-CURRENT VERTICAL AMPLIFIER

[75] Inventor: Tex K. Monroe, Batavia, N.Y.

[73] Assignee: GTE Sylvania Incorporated, Stamford, Conn.

[21] Appl. No.: 838,549

[22] Filed: Oct. 3, 1977

[51] Int. Cl.$^2$ .................... H01J 29/70; H01J 29/72
[52] U.S. Cl. ................................ 315/396; 315/389
[58] Field of Search ............... 315/387, 389, 396, 397, 315/403, 408

[56] References Cited

U.S. PATENT DOCUMENTS

| | | | |
|---|---|---|---|
| 3,628,083 | 12/1971 | Holmes | 315/387 X |
| 3,859,557 | 1/1975 | Grant et al. | 315/387 X |
| 4,004,190 | 1/1977 | Simpson | 315/389 X |
| 4,019,093 | 4/1977 | Klein | 315/370 |

FOREIGN PATENT DOCUMENTS 1440098  6/1976  United Kingdom ..................... 315/397

*Primary Examiner*—Theodore M. Blum
*Attorney, Agent, or Firm*—John A. Odozynski

[57] ABSTRACT

A vertical amplifier provides a deflection or yoke current independent of the yoke impedance or other impedances in the yoke current path. The amplifier comprises a general-purpose operatonal amplifier that develops an output voltage in a manner that maintains identical voltages at its inverting and non-inverting inputs. A feedback resistance is connected in the yoke current path, thereby developing a voltage indicative of the yoke current. As a result, the yoke current waveform can be made identical to or a desired variation of a current commanding voltage waveform applied to the non-inverting input. A particular variation of the feedback resistance transforms an S-shaped current waveform into a sawtooth voltage waveform, thereby providing the desired deflection linearity.

7 Claims, 2 Drawing Figures

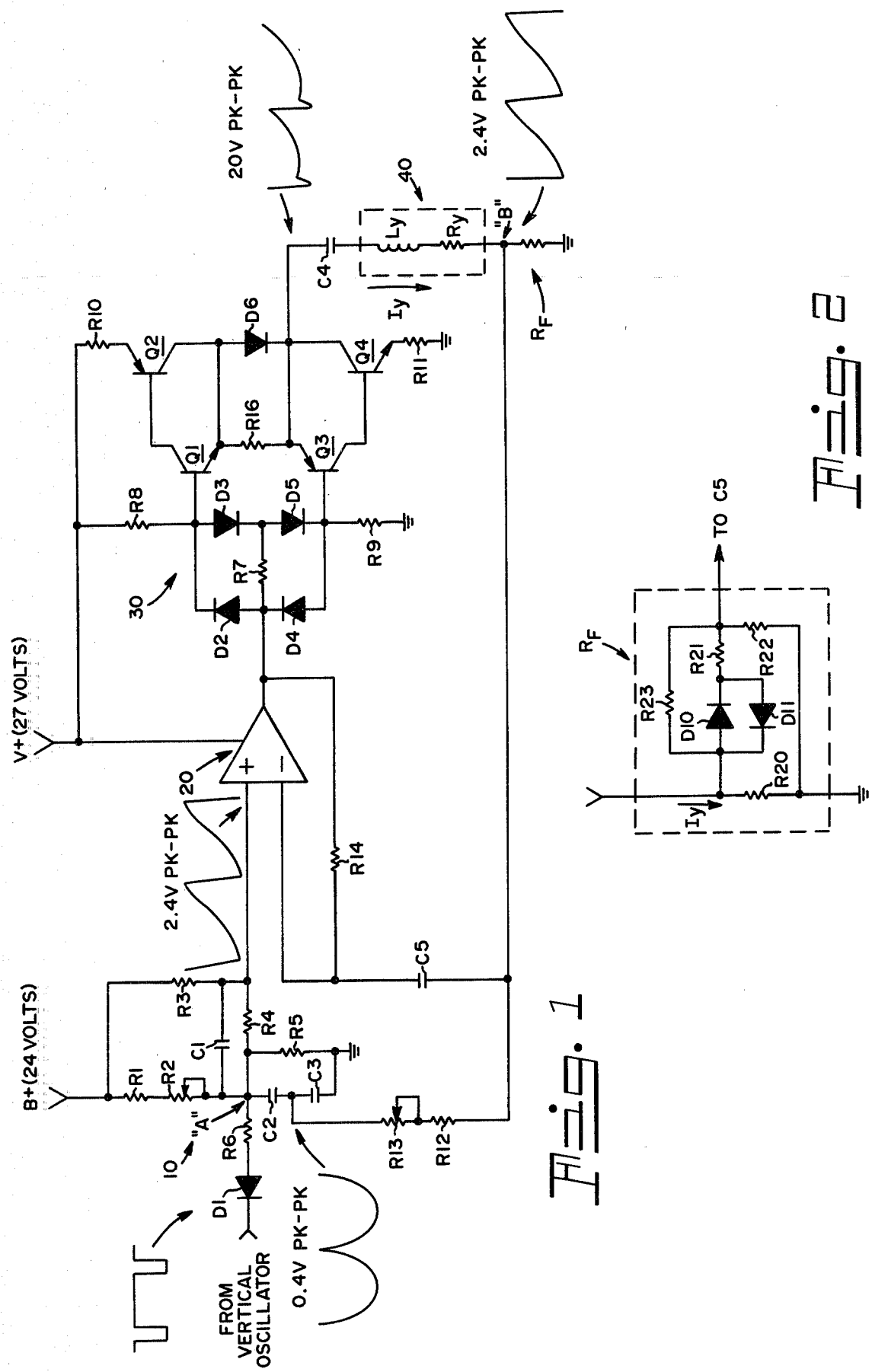

CONSTANT-CURRENT VERTICAL AMPLIFIER

FIELD OF THE INVENTION

This invention relates to circuitry for developing a current of a desired amplitude and waveform in an unknown or variable impedance, the current amplitude and waveform being substantially independent of the impedance. In a particular application, a vertical deflection amplifier develops a yoke current that is substantially independent of the yoke impedance parameters.

BACKGROUND OF THE INVENTION

It has been found advantageous to use integrated circuits in the vertical deflection amplifier section of television receivers. However, because the vertical deflection amplifier is often required to accommodate various deflection yokes or varying yoke parameters, conventional integrated circuit vertical deflection amplifiers may be ill-suited for a particular application. For example, integrated circuit amplifiers with high output current capabilities can be prohibitively expensive or exhibit excessive power dissipation in applications having more modest output current requirements. Furthermore, conventional integrated circuit vertical deflection amplifiers typically contain complex circuitry within the chip that renders these amplifiers insusceptible of desired modifications and consequently incapable of meeting the requirements of varying applications. In particular, output circuitry within integrated circuits having low output current capabilities prohibits their use in conjunction with discrete current-boosting circuitry in higher current applications.

In addition, in order to be able to use a vertical deflection amplifier with various types of yokes or with yokes having varying parameters, it is desirable that the amplifier provide a deflection current whose amplitude and waveform is independent of the yoke impedance.

SUMMARY OF THE INVENTION

These and other objects, advantages, and capabilities are achieved in a constant-current amplifier that develops a current in an impedance, the current being substantially independent of the magnitude of the impedance. The amplifier comprises an opamp for providing an output to the impedance, a current commanding means that provides a periodic signal to the op-amp's non-inverting input, and a feedback resistance in series with the impedance and coupled to the non-inverting input of the op-amp. Because the op-amp's high gain maintains substantially identical voltages at its inputs, the current developed in the impedance is a predetermined replica of the signal provided by the current commanding means. A current amplifier connected between the output of the op-amp and the impedance amplifies the op-amp current, thereby satisfying the current requirements of the impedance.

BRIEF DESCRIPTION OF THE DRAWINGS

FIG. 1 is a schematic diagram of the subject invention, including relevant signal waveforms.

FIG. 2 is a schematic diagram of an alternative embodiment of a feedback resistance comprised by the invention.

DETAILED DESCRIPTION OF THE PREFERRED EMBODIMENT

For a better understanding of the present invention, together with other and further objects, advantages and capabilities thereof, reference is made to the following disclosure and appended claims in connection with the above description of some of the aspects of the invention.

As illustrated in FIG. 1, a current commanding means 10 is connected to the non-inverting input of an operational amplifier (op-amp) 20. As conventionally understood, applying a signal to the non-inverting input results in an output substantially in phase with the input. Current commanding means 10 comprises a fixed resistor R1 and a variable resistor R2 series-connected between a source of potential, B+ (24 volts), and a terminal A, a resistor R3 connected between B+ and the non-inverting input of the op-amp, a parallel connected resistor R4 and capacitor C1 connected between the input and terminal A, a capacitance consisting of series-connected capacitors C2 and C3 connected between terminal A and circuit ground, a resistor R5 in parallel with C2 and C3, and a series-connected diode D1 and resistor R6 connected between terminal A and a source of signals generated by the vertical oscillator. The vertical oscillator signals are indicative of the respective trace and retrace portions of the vertical oscillator cycle.

Resistors R1, R2, R3, R4 and R5 determine the quiescent DC voltage level at the non-inverting input of the operational amplifier. Because the op-amp input impedance is very high, this voltage will be approximately equal to 24 V-R3 $(24V - V_A)/R3 + R4$, where $V_A$ is the quiescent DC voltage at terminal A. In the absence of the vertical oscillator signal, $V_A = 24V$ $(Rx)/Rx + R5$, where $RX = (R1+R2)$ $(R3+R4)/R1+R2+R3+R4$. The value of the DC voltage at the non-inverting input of the op-amp is chosen to be approximately one-half the op-amp supply voltage $V+$. Consequently, for a 27 volt supply as shown, the voltage at the non-inverting input will be 13.5V, thereby obviating the need for a dual-polarity op-amp voltage supply.

The high input impedance of the op-amp may also result in high-frequency noise pickup at the non-inverting input. C1 tends to reduce the effect by providing a relatively low impedance path to ground for high-frequency noise signals.

Op-amp 20 provides an output to a substantially unity-voltage gain current amplifier 30. Current amplifier 30 allows the deflection amplifier to utilize a general purpose, commercially available op-amp, such as the Fairchild integrated circuit μa 741. Although the op-amp alone has modest output current capabilities, the current amplifier can accommodate deflection yokes requiring 6-8 amperes peak-to-peak. In deflection systems having less stringent output-current requirements, current amplifier 30 could be modified accordingly, or eliminated altogether. In this embodiment amplifier 30 comprises an NPN transistor Q1 having a collector and emitter respectively connected to the base and emitter of a PNP transistor Q2, a PNP transistor Q3 connected in an identical manner to an NPN transistor Q4, bias resistors R8, connected between $V+$ and the base of Q1, and a resistor R9, connected between the base of Q3 and circuit ground, diodes D2 and D4 connected between the output of the op-amp and the bases of Q1 and Q3 respectively, diodes D3 and D4, series-connected between the bases of Q1 and Q3 and coupled at their junction through a resistor R7 to the output of the op-amp, a parallel-connected resistor R16 and diode D6 connected between the emitters of Q1 and Q3, and emitter resistors R10 and R11, R10 connected between V+ and the emitter of Q2 and R11 connected between the emitter of Q4 and circuit ground. Q1 and Q2 combine to form an effective high gain PNP transistor and supply yoke current in a positive direction, that is, in the direction shown in FIG. 1. Conversely, Q3 and Q4 combine to form an effective high-gain NPN transistor and supply yoke current in the opposite, that is, negative direction.

Amplifier 20 amplifies the output current of the op-amp and develops a yoke current Iy. Iy is coupled through a capacitor C4 to a yoke 40. The yoke is illustrated in its equivalent form as a series connected resistance, Ry, and an inductance, Ly. Ry and Ly may have the values of approximately 1 ohm and 850 microhenries respectively. Iy develops a voltage across a feedback resistance $R_F$ which is connected in series with the yoke current path. While in this particular embodiment of the invention $R_F$ is connected between one end of the yoke winding and ground, it is clear that in alternative embodiments it may be desirable as well as convenient to have $R_F$ connected between the yoke and source of DC potential. The voltage at a terminal B is AC coupled through a capacitor C5 to provide a feedback voltage at the inverting input of the op-amp and coupled through a linearity network comprising a fixed resistor R12 and a variable Resistor R13 to the junction of capacitors C2 and C3 of the current commanding means.

A principal function of a deflection amplifier in electromagnetic deflection systems such as those used in television receivers is to provide a substantially linearly varying, or sawtooth, deflection current. However, in conventional systems comprising deflection yokes such as the instant yoke 40, the deflection or yoke current, Iy, is dependent on the yoke impedance and particularly on Ry and Ly. Variations in Ry and Ly, as they exist between yokes of different types or different yokes of the same type or as they occur in the same yoke over time and temperature give rise to variations in the amplitude, linearity, and rate of change of Iy.

In addition to the effects of yoke parameters, it also may be necessary or desirable to include other circuitry, such as topbottom pincushion or convergence circuitry, in the path of the yoke current. This circuitry may also include time-varying impedances that give rise to uncontrollable and undesirable variations in the yoke current. In a manner to be presently described, the vertical deflection amplifier comprised by this invention develops a yoke current that is substantially independent of yoke impedance or other impedances in the deflection current path.

During vertical trace the voltage from the vertical oscillator at the cathode of D1 is approximately 10 volts. D1 is back biased and effectively disconnects the current commanding means 10 from the vertical oscillator. C1 and C2 are charged through R1 and R2. Disregarding, for the time, the effect of C1 and C3 the voltage across C2 will increase exponentially with a time constant equal to $(C_2)(R_x)(R_5)/R_x+R_5$, approaching a value equal to $V_A$. In operation, the negative-going pulse from the vertical oscillator during retrace will turn on D1 and discharge C2 before the value is reached. R6 limits the amplitude of the discharge current.

The periodic, substantially sawtooth voltage waveform at terminal A is coupled by C1 to the non-inverting input of the op-amp. Although an op-amp is conveniently used in this embodiment, any amplifying circuit configuration having relatively high impedance, differential inputs and a high open-loop gain could be suitable. The high open-loop gain of the op-amp develops an output that maintains substantially identical voltages at the non-inverting and inverting inputs. A resistor R14 assures that the DC voltage at the inverting input, and hence the quiescent voltage at the op-amp output, will be equal to the DC voltage at the non-inverting input, that is, approximately 13.5 volts. As the AC signal at the non-inverting input varies around 13.5 volts in response to the signal developed by current commanding means 10, the op-amp will develop an output so as to maintain a substantially identical AC voltage at the inverting input. However, the AC signal at the inverting input is a voltage equal to $(R_F) \times (I_y)$. The result is that the deflection amplifier provides a yoke current Iy having an amplitude equal to $V_B/R_F$, where $V_B$ is the AC signal at the non-inverting input of the op-amp. Furthermore, the deflection current waveform will be a replica of voltage waveform developed by the current commanding means 10 and applied to the non-inverting input of the op-amp. If the current commanding means develops a 2.4 volt peak-to-peak sawtooth, as shown in FIG. 1, and if $R_F$ is 0.39 ohms, Iy will be a sawtooth waveform with a peak-to-peak amplitude of approximately 6 amperes. For values of Ry and Ly previously mentioned, the peak-to-peak voltage output of the op-amp, which is substantially identical to the waveform at the cathode on D6, will be approximately 20 volts, as shown in FIG. 1. Consequently, when operating from a 27-volt op-amp supply, it is necessary to maintain a quiescent op-amp output voltage in the neighborhood of 13.5 volts.

In order to develop the conventional "S-shaped" deflection current waveform required to provide a linear image on a television picture tube, the voltage at point B is, in effect, integrated by the combined series resistance of R12 and R13 and the capacitance of C3. The resulting parabolic waveform at the junction of C2 and C3 is added to the exponentially varying waveform across C2 to provide a degree of S-shaped correction to the otherwise substantially sawtooth waveform at terminal A and coupled to the non-inverting input of the op-amp.

Although the circuitry described above is capable of providing the desired amount of S-shaped correction, an alternative embodiment of the feedback resistance, shown in FIG. 2, provides an additional source of S-shaped correction. The alternative embodiment comprises, as before, a resistor, R20, connected between one end of the yoke 40 and circuit ground. In addition, the feedback resistance comprises parallel connected diodes D10 and D11 connected to the junction of R20 and yoke 40 and to one end of a resistor R21, a resistor R22 connected between the other end of R22 and circuit ground, and a resistor R23 connected to the junction of R21 and R22 and to the junction of R20 and yoke 40.

In this configuration, the combined resistance of R21, R22, and R23 is sufficiently greater than R20 so that substantially the entire yoke current Iy flows through R20 and the voltage at terminal B, $V_B$, is equal to $(R20) \times (I_y)$. This voltage is divided to develop a feedback voltage across R22 and coupled to the op-amp non-inverting input through C5. For low values of yoke current, that is, for deflection near the center of the screen, diodes D10 and D11 will be non-conductive. The feedback voltage will be equal to $V_B R_{22}/R_{22}+R_{23}$. Resistors R20, R21, R22, and R23 are chosen so that the voltage division of $V_B$ will render D10 and D11 conductive for high values of yoke current, that is, for deflection near the top or bottom of the screen. D10 will conduct for positive values of $I_y$ and D11 will conduct for negative values. In either case the feedback voltage will be $$\frac{V_B (R22)}{R22 + \frac{(R21)(R23)}{R21 + R23}}.$$

Because the feedback voltage is a greater proportion of $V_B$ for deflection near the extremities of the screen, less yoke current will be required to develop a voltage equal to the voltage at the non-inverting input of the operational amplifier. As a result, a sawtooth current commanding waveform will cause the desired S-shaped current waveform to be developed in the deflection yoke.

Accordingly, the vertical deflection amplifier described herein uses a readily available, general-purpose operational amplifier in a circuit that may be used to drive a variety of deflection yokes. The yoke current waveform is independent of the yoke impedance or other impedances in the yoke current path and is controlled by a current commanding voltage waveform provided to the non-inverting input of the op-amp and a feedback voltage proportional to the yoke current. The feedback resistance may be tailored to effect the magnitude and waveshape of the yoke current. The current amplifier may be modified to accommodate the current requirements of the particular deflection system with which the vertical amplifier is used.

While there has been shown and described what is at present considered to be the preferred embodiment of the invention, it will be obvious to those skilled in the art that various changes and modifications may be made therein without departing from the invention as defined by the appended claims.

What is claimed is:

1. In a television receiver having a vertical deflection yoke winding and a constant-current vertical amplifier circuit for developing, in response to a current-commanding signal at the amplifier input, a yoke current independent of the yoke impedance, an improved current-sensing feedback resistance comprising:
    a first resistor connected between one end of the yoke winding and a reference potential;
    a parallel-connected second resistor and first diode connected at one end to the junction of the yoke winding and first resistor;
    a third resistor connected between another end of the parallel-connected second resistor and first diode and said potential whereby a feedback voltage is developed across the third resistor and a greater proportion of feedback voltage is developed in response to greater amplitudes of yoke current whereby a substantially S-shaped yoke current waveform is developed in response to a substantially sawtooth current-commanding signal.

2. An improved current-sensing feedback resistance as defined in claim 1 further comprising a second diode having a cathode coupled to the anode of the first diode and an anode coupled to the cathode of the first diode so that the first diode is conductive in response to yoke currents of sufficient amplitude and one polarity and the second diode is conductive in response to yoke currents of sufficient amplitude and opposite polarity.

3. In a television receiver having a deflection yoke winding and a constant-current amplifier circuit for developing a yoke current independent of the yoke impedance in response to a current-commanding signal applied to a first amplifier input, an improved current-sensing feedback resistance coupled to a second amplifier input and comprising:
    first means connected to yoke winding for developing a voltage in proportion to the yoke current;
    dividing means, including a parallel-connected diode and first resistor connected at one end to the junction of the yoke winding and first means and a second resistor coupled between the other end of the parallel connected diode and first means and a reference potential and coupled to the second amplifier input, said means for developing a feedback voltage in response to the yoke current whereby a greater proportion of feedback voltage is developed in response to greater amplitudes of yoke current so that substantially S-shaped yoke current waveform is developed in response to a substantially sawtooth current-commanding signal.

4. An improvement as defined in claim 3 wherein the first means comprises a resistor connected between the yoke and the reference potential.

5. In a television receiver having a deflection yoke winding and a constant-current amplifier circuit for developing a yoke current independent of the yoke impedance in response to a current-commanding signal applied to a first amplifier input, an improved current-sensing feedback resistance coupled to a second amplifier input and comprising:
    (a) first means connected to yoke winding for developing a voltage in proportion to the yoke current; and
    (b) dividing means connected between the junction of the first means and the yoke winding and a reference potential for developing a feedback voltage in response to the yoke current, said dividing means comprising:
    parallel-connected first and second diodes connected at one end to the junction of the yoke winding and first means;
    a first resistor series-connected to the other end of the diodes;
    a second resistor connected in parallel to the series-connected resistor and diodes;
    a third resistor connected to the reference potential and coupled through the second resistor to the junction of the yoke winding and first means whereby a greater proportion of feedback voltage is developed in response to greater amplitudes of yoke current so that substantially S-shaped yoke current waveform is developed in response to a substantially sawtooth current-commanding signal.

6. An improvement as defined in claim 5 wherein the anode of the first diode is connected to the cathode of the second diode and the cathode of the first diode is connected to the anode of the second diode.

7. An improvement as defined in either claim 5 wherein the first means comprises a resistor connected between the yoke and the reference potential.

* * * * *

UNITED STATES PATENT AND TRADEMARK OFFICE
CERTIFICATE OF CORRECTION

PATENT NO. : 4,188,567
DATED : February 12, 1980
INVENTOR(S) : Tex Kevin Monroe

It is certified that error appears in the above-identified patent and that said Letters Patent are hereby corrected as shown below:

Column 6, Line 65: "either Claim 5" should read --- Claim 5 ---.

*Signed and Sealed this*

*Seventeenth* Day of *June 1980*

[SEAL]

Attest:

SIDNEY A. DIAMOND

*Attesting Officer*

*Commissioner of Patents and Trademarks*